United States Patent [19]

Schmidt

[11] Patent Number: 5,909,454
[45] Date of Patent: Jun. 1, 1999

[54] INTERMEDIATE RATE APPLICATIONS OF PUNCTURED CONVOLUTIONAL CODES FOR 8PSK TRELLIS MODULATION OVER SATELLITE CHANNELS

[75] Inventor: Mark Schmidt, San Diego, Calif.

[73] Assignee: General Instrument Corporation, Horsham, Pa.

[21] Appl. No.: 09/008,976

[22] Filed: Jan. 20, 1998

[51] Int. Cl.[6] .................................................. G06F 11/00
[52] U.S. Cl. ................................................. 371/43.2
[58] Field of Search ............................. 371/43.1, 43.2, 371/43.7, 37.11, 37.8, 43.4; 375/259, 261, 265

[56] References Cited

U.S. PATENT DOCUMENTS

| | | | |
|---|---|---|---|
| 4,462,101 | 7/1984 | Yasuda et al. | 371/43.2 |
| 4,669,084 | 5/1987 | Hartman et al. | 371/43.1 |
| 5,233,629 | 8/1993 | Paik et al. | 375/262 |
| 5,233,630 | 8/1993 | Wolf | 375/308 |
| 5,305,352 | 4/1994 | Calderbank et al. | 375/39 |
| 5,396,518 | 3/1995 | How | 375/365 |
| 5,408,502 | 4/1995 | How | 375/340 |
| 5,469,452 | 11/1995 | Zehavi | 371/43.4 |
| 5,511,082 | 4/1996 | How et al. | 371/43.2 |

Primary Examiner—Trinh L. Tu
Attorney, Agent, or Firm—Barry R. Lipsitz

[57] ABSTRACT

A method and apparatus are provided for convolutionally encoding digital data with a rate $5/8$ convolutional code. A standard rate $1/2$ convolutional code is punctured to rate $5/8$ using a puncture map of $$\begin{Bmatrix} 11111 \\ 11100 \end{Bmatrix}$$

and octal generators 133, 171 wherein the constraint length K=7. An incoming data stream is processed using the rate $5/8$ code. In another embodiment, a rate $1/3$ convolutional code is punctured to rate 5/8 using a puncture map of $$\begin{Bmatrix} 00000 \\ 11101 \\ 11110 \end{Bmatrix}$$

and octal generators 117, 135, 161 wherein the constraint length K=7.

8 Claims, 7 Drawing Sheets

INTERMEDIATE RATE APPLICATIONS OF PUNCTURED CONVOLUTIONAL CODES FOR 8PSK TRELLIS MODULATION OVER SATELLITE CHANNELS

BACKGROUND OF THE INVENTION

The present invention relates to the communication of digital data using a rate ⅝ punctured convolutional code, and more particularly to such a code that is obtained by puncturing a "standard" rate ½ or rate ⅓ convolutional code.

Pragmatic Trellis-Coded Modulation (TCM) is a combined Forward Error Correction (FEC) coding and modulation scheme that utilizes a well-known and "standard" underlying convolutional code applied to certain bits of M-ary Phase Shift Keyed (MPSK) or M-ary Quadrature Amplitude Modulation (MQAM) symbol mappings. It's utility is in providing increased data rate over bandlimited channels using nearly standard off-the-shelf decoding hardware. Viterbi et. al. proposed this scheme and gave an example of applying the output of the underlying standard rate ½, constraint length K=7 encoder as the two-least-significant bits (LSBs) of each 3-bit 8PSK symbol and using an uncoded, or parallel branch, bit to choose the most-significant-bit (msb) of the 3-bit 8PSK symbol. Viterbi, Andrew et. al., "A Pragmatic Approach to Trellis-Coded Modulation," *IEEE Communications Magazine*, July 1989, pp. 11–19. Viterbi's design takes two information bits to produce three channel bits or one 8PSK symbol (one parallel, uncoded bit and one bit that is rate ½ encoded into two bits) giving a code rate of ⅔. This code has been employed as a standard in an Intelsat satellite service. *Intelsat Earth Station Standards (IESS) Doc.* IESS-310, "Performance Characteristics for Intermediate Data Rate Digital Carriers Using Rate ⅔ TCM/8PSK and Reed-Solomon Outer Coding (TCM/IDR)," Approval Date: Sep. 16, 1996, pp. 14–22.

A later work by Wolf et. al. extends pragmatic coding to higher rates, e.g., a rate ⅚ code is built by puncturing the "standard" rate ½, K=7 code to rate ¾ and applying its output along with two uncoded, parallel branch bits over two 8PSK symbol periods. Wolf, Jack Keil and Zehavi, Ephraim, "P² Codes: Pragmatic Trellis Codes Utilizing Punctured Convolutional Codes," *IEEE Communications Magazine*, February 1995, pp. 94–99. Other references of interest include U.S. Pat. Nos. 5,233,629 ("Method and Apparatus For Communicating Digital Data Using Trellis Coded QAM") to Paik et al., 5,396,518 ("Apparatus and Method for Communicating Digital Data Using Trellis Coding with Punctured Convolutional Codes") and 5,408,502 ("Apparatus and Method for Communicating Digital Data Using Trellis Coded QAM With Punctured Convolutional Codes") to How, and 5,511,082 ("Punctured Convolutional Encoder") to How et al.

Puncturing a code is a method for deleting (i.e., not transmitting) certain encoder outputs in a regular manner such that the code still has good distance properties. This can be accomplished, for example, by deleting one of the two rate ½ encoder outputs on every other encoder cycle. In this manner, three output code bits are formed for every two input information bits (or every two encoder cycles) giving a rate ⅔ code. Punctures for the "standard" rate ½, K=7 code that provide good Hamming distance are well-known. See, for example, Yasuda, Y. et. al., "High-Rate Punctured Convolutional Codes for Soft Decision Viterbi Decoding," *IEEE Transactions on Communications*, Vol. COM-32, 1984, pp. 315–319.

Trellis coded modulation (TCM) can be used to achieve increased throughput over a given bandlimited communication channel. The rate ⅔ code delivers 60 Megabits/second (Mbps) when used with an 8PSK symbol for a baud rate of 30 Megasymbols/second (Msps); the ⅚ code delivers 75 Mbps when used with a 30 Msps 8PSK rate. In comparison, a non-TCM scheme using a standard rate ⅞ coded, 30 Msps Quadrature PSK (QPSK) signal delivers 52.5 Mbps. The increased throughput achieved with TCM over standard coded QPSK imposes an increase in the required Signal- or Carrier-to-Noise Ratio (SNR or CNR) for a given Bit Error Rate (BER) performance value termed "threshold". Rate ⅔ pragmatic TCM has a CNR threshold that is slightly worse than standard coded rate ⅞ QPSK but is 3 dB lower than rate ⅚ pragmatic TCM.

Both of the pragmatic TCM example designs (rate ⅔ and ⅚ 8PSK) have been proposed for use as standards in satellite transmission of digital television (DTV) signals. These existing pragmatic schemes are found through computer simulation to require a 3 dB difference in the CNR for threshold BER operation. CNR is related directly to the required receiver antenna size, receiver noise figure, and satellite transmit power.

Moreover, past implementations of pragmatic TCM have been performed on the "standard" rate ½, K=7 convolutional code using "standard" puncture maps found to be optimum for this code in a Hamming distance sense (i.e., for use in schemes in which the coding is decoupled from the modulation scheme instead of integrated as in TCM). See, e.g., the Yasuda et al. article referred to above.

It would be advantageous to provide other code rates between and above ⅔ and ⅚ that offer varying requirements on threshold CNR and bit rate throughput so as to offer flexibility in operation with various communication channels. It would be further advantageous to puncture the "standard" code and other codes to achieve, e.g., an overall rate ¾ 8PSK TCM code that delivers 67.5 Mbps for a 30 Msps baud rate and has a threshold CNR lying midway between the rate ⅔ and ⅚ pragmatic implementations.

The present invention provides a trellis-coded modulation scheme having the aforementioned and other advantages.

SUMMARY OF THE INVENTION

In accordance with the present invention, a method is provided for convolutionally encoding digital data with a rate ⅝ convolutional code. The rate ⅝ code is obtained by puncturing a rate ½ convolutional code based on octal generators 133, 171, using a puncture map of $$\begin{Bmatrix} 11111 \\ 11100 \end{Bmatrix}.$$

The constraint length K of the rate ½ code is 7 (K=7). As will be appreciated by those skilled in the art, the rate ½ code is a sixty-four state code, since the number of states is defined as $2^{K-1}$.

An effective overall encoder rate of ¾ is provided by combining:

(i) eight coded bits produced by said rate ⅝ code from five input bits, with (ii) four uncoded bits.

A rate ⅝ convolutional encoder is also disclosed. The rate ⅝ encoder includes means for puncturing a rate ½ convolutional code based on octal generators 133, 171 and having a constraint length K=7. The puncturing means uses a puncture map of:

$$\begin{Bmatrix} 11111 \\ 11100 \end{Bmatrix}.$$

An effective encoder rate of ¾ is provided by combining:

(i) eight coded bits produced by said rate ⅝ encoder from five input bits, with (ii) four uncoded bits.

A method is also provided for convolutionally encoding digital data with a rate ⅝ convolutional code using an underlying rate ½ convolutional code. The rate ½ convolutional code is based on octal generators 117, 135, 161 with constraint length K=7, and is punctured to rate ⅝ using a puncture map of:

$$\begin{Bmatrix} 00000 \\ 11101 \\ 11110 \end{Bmatrix}$$

An incoming data stream is processed according to the rate ⅝ code. An effective overall encoder rate of ¾ is provided by combining:

(i) eight coded bits produced by said rate ⅝ code from five input bits, with (ii) four uncoded bits.

A corresponding rate ⅝ convolutional encoder comprises a rate ½ convolutional encoder based on octal generators 117, 135, 161 and having an input for receiving a data stream to be encoded. Means are provided for puncturing the code from the rate ½ convolutional encoder to rate ⅝ using a puncture map of $$\begin{Bmatrix} 00000 \\ 11101 \\ 11110 \end{Bmatrix},$$

wherein the constraint length K=7. An effective encoder rate of ¾ is provided by combining:

(i) eight coded bits produced by said rate ⅝ code from five input bits, with (ii) four uncoded bits.

DETAILED DESCRIPTION OF THE INVENTION

The present invention provides flexible coding and transmission rates in a trellis coded modulation scheme using punctured convolutional codes, in order to optimize satellite communication link performance. In particular, a rate ¾ "pragmatic" code is formed by puncturing the rate ½ standard code to rate ⅝, and combining one uncoded bit with two encoder output bits over four 8PSK symbol periods. A code in accordance with the invention can deliver, for example, 2.25 bps (3×¾) using 4×2=8 signal dimensions (8-D).

Figure 1:
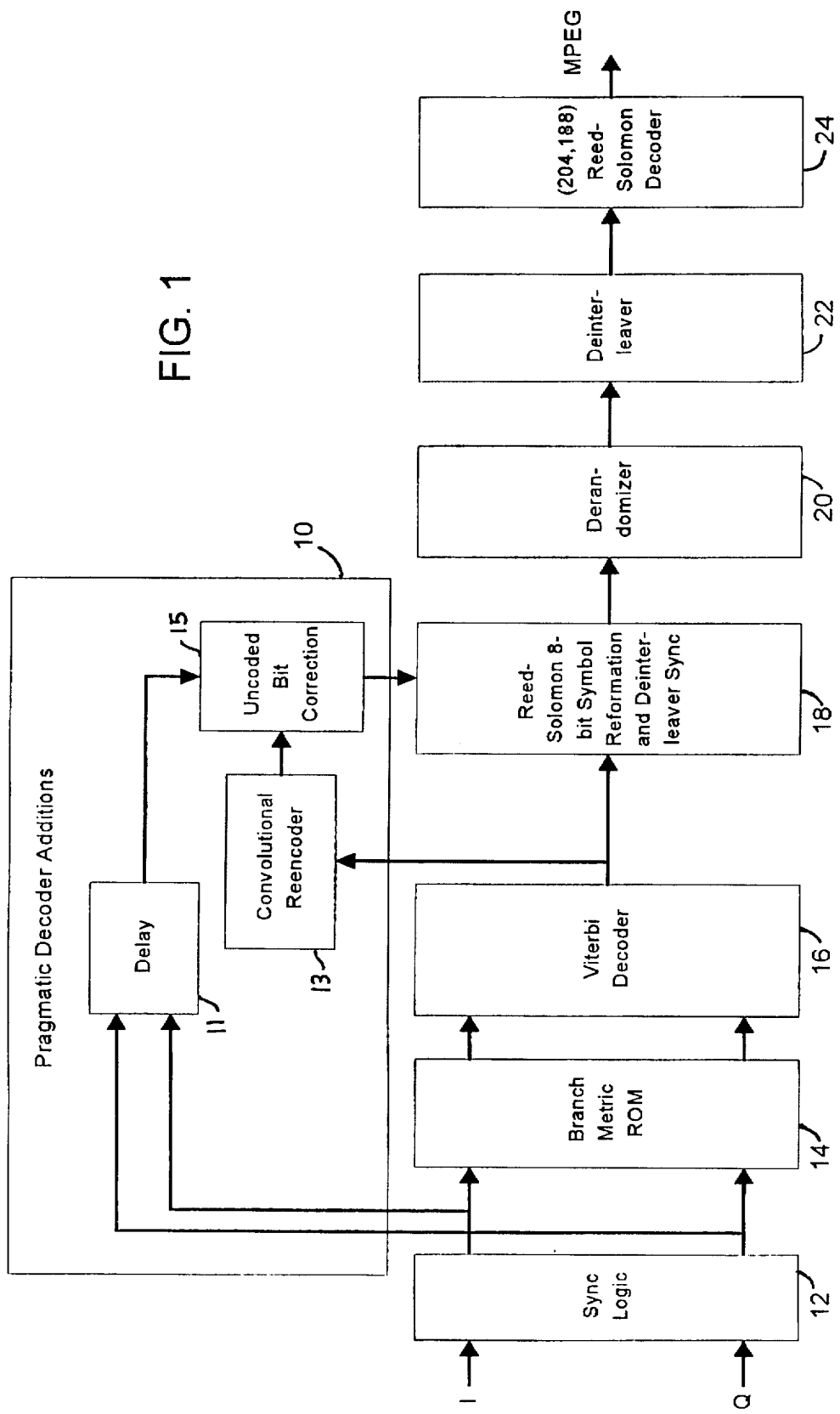
FIG. 1 is a block diagram of a forward error correction (FEC) decoder block diagram in accordance with the present invention.

FIG. 1 is a block diagram of an FEC decoder that can be used with the codes of the present invention. The coding scheme uses a concatenated code having, for example, a (204,188) Reed-Solomon outer block code matched to the standard transport block size promulgated by the Motion Picture Experts Group (MPEG). Derandomization and deinterleaving may be performed as in the well known DigiCipher (proprietary to General Instrument Corporation of Horsham, Pa., USA) or Digital Video Broadcast (DVB) schemes. There is some flexibility in the choice of inner codes, however, and this choice has a great impact on the design of the inner decoder.

In the implementation illustrated in FIG. 1, the in-phase (I) and quadrature (Q) inputs of the signal to be decoded are input to a synchronization logic circuit 12, as well known in the art. Branch metrics are determined using a branch metric read only memory (ROM) 14, which outputs the corresponding branch metrics to a Viterbi decoder 16. The output of the Viterbi decoder is provided to a Reed-Solomon 8-bit symbol reformation and deinterleaver synchronization circuit 18. The resulting output is derandomized and deinterleaved in derandomizer and deinterleaver circuits 20, 22, respectively for input to a Reed-Solomon decoder 24 which provides, e.g., an MPEG compatible data stream.

The present invention uses a pragmatic code, which requires the above-mentioned synchronization and branch metric logic circuits as well as the additional components generally designated by reference numeral 10 in FIG. 1. In particular, the pragmatic code requires a sample delay memory 11, convolutional re-encoder 13 and uncoded bit correction logic 15.

Pragmatic decoders use the standard rate ½, K=7 code (octal generators 133 and 171) as the underlying code for encoding the two least significant bits (LSBs) of an 8PSK symbol. This code has good hamming distance properties and the mapping to 8PSK cosets preserves this in Euclidean distance as well for the rate ½ code. Puncturing this code yields other higher rate codes that also have good hamming distance properties. In the preferred embodiment of the present invention, the code is punctured to rate ⅝ for implementation of a rate ¾ trellis code. A search was performed to find rate ⅝ punctures with good distance properties that facilitate trellis encoding of the LSBs of 8PSK symbols. Two good ⅝ codes were found as follows:

$G1=133, P1=11111$ $G0=171, P0=11100$ and $G1=133, P1=11111$

G0=171ₛ P0=11010 with the latter pattern providing a slightly better hamming distance profile. The first puncture pattern works well because the last two phases of the puncture pattern are punctured and may be used to map into two LSBs of the 4$^{th}$ 8PSK symbol in the puncture cycle. The two ⅝ punctured codes lie within 0.1 dB of each other in union bounded QPSK bit error rate (BER) performance.

Another rate ⅝ code of interest is:

G2=117ₛ P2=00000

G1=135ₛ P1=11101

G0=161ₛ P0=11110

This code is particularly useful in implementing a ⅝ code punctured from a rate ⅓, K=7 code, for use with the Digicipher® II digital satellite communication system proprietary to General Instrument Corporation, the assignee of the present application.

Figure 2:
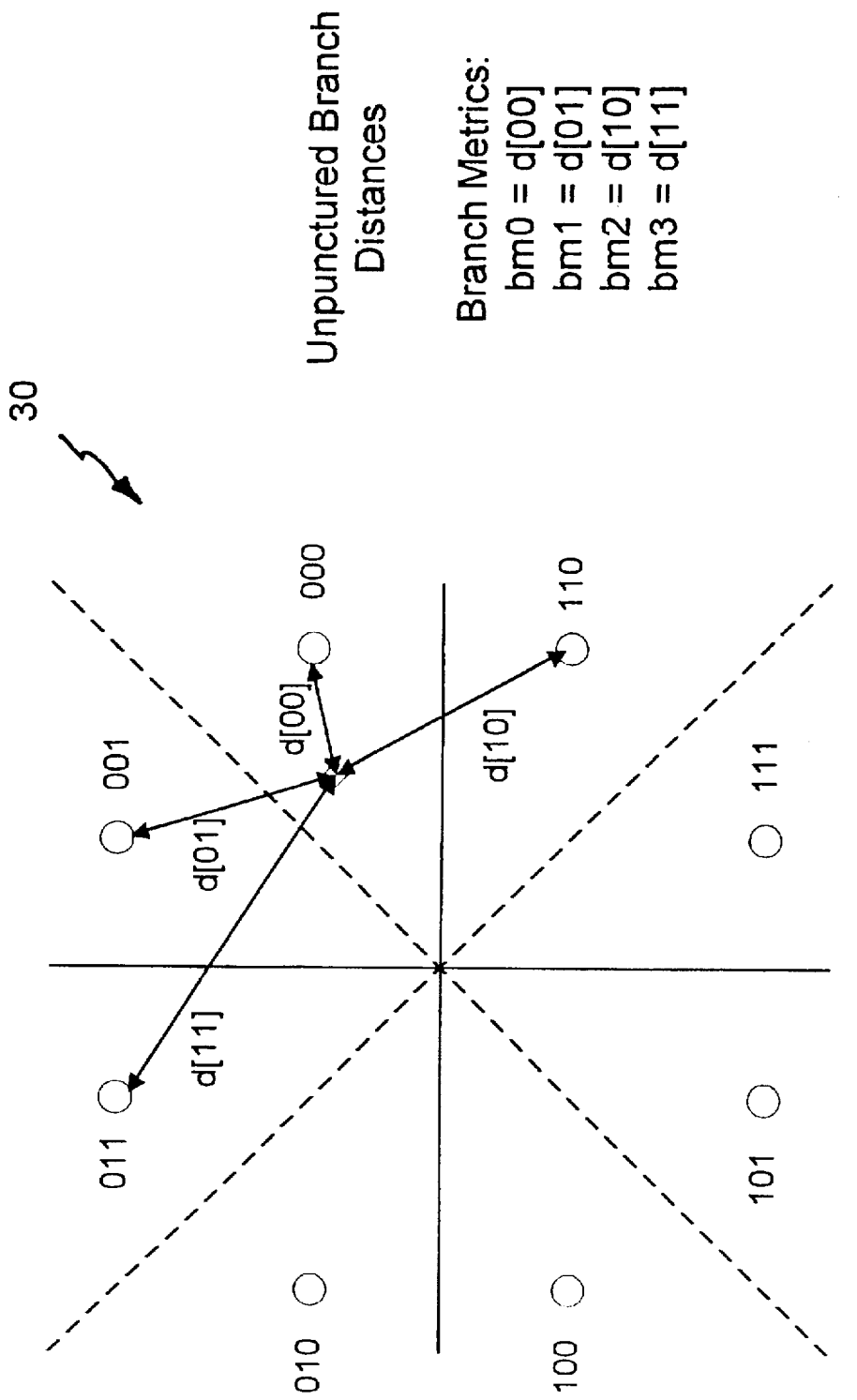
FIG. 2 is an illustration of a branch metric computation for unpunctured branch distances in accordance with the present invention.
Figure 3:
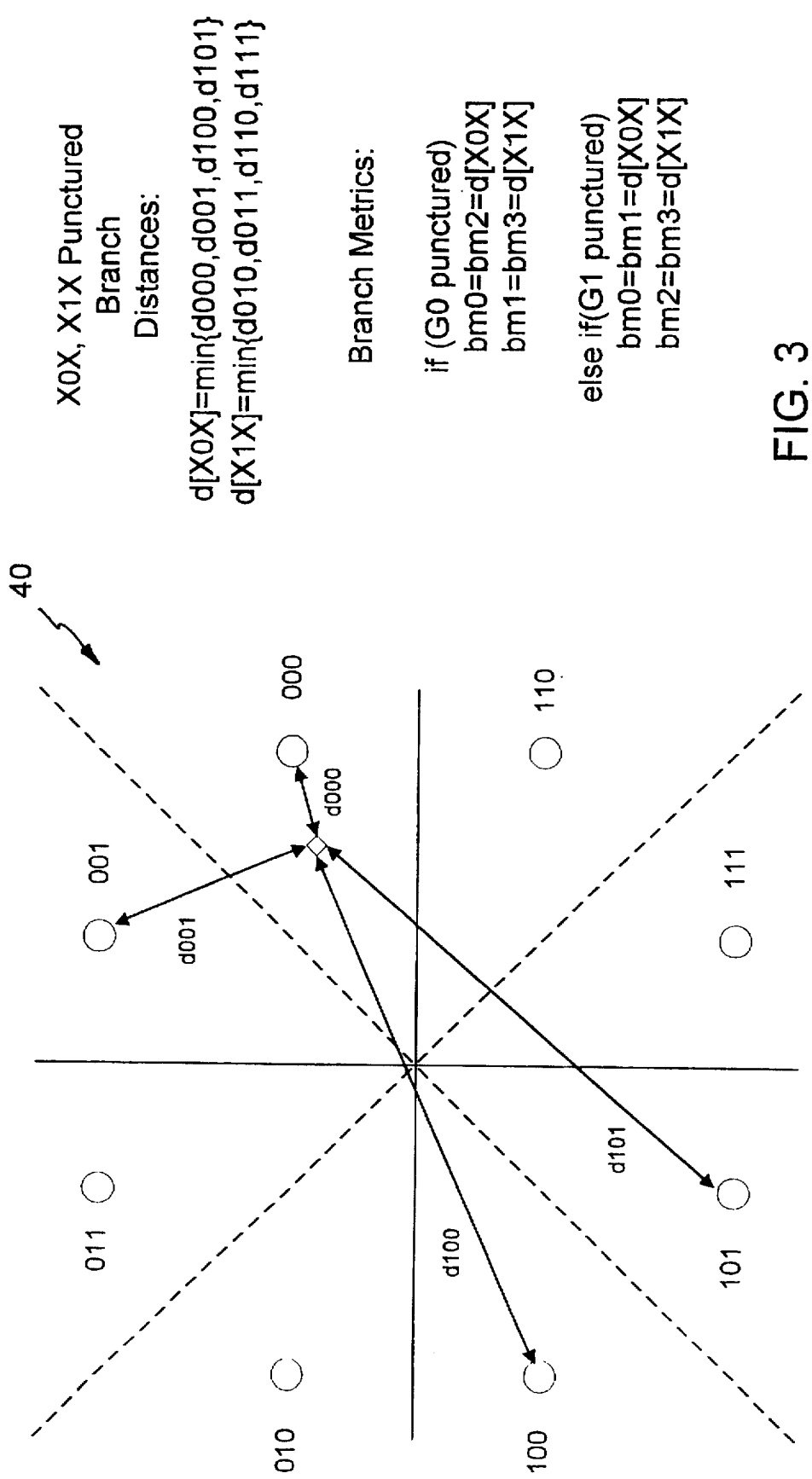
FIG. 3 is an illustration of a branch metric computation for X0X, X1X punctured branch distances in accordance with the present invention.
Figure 4:
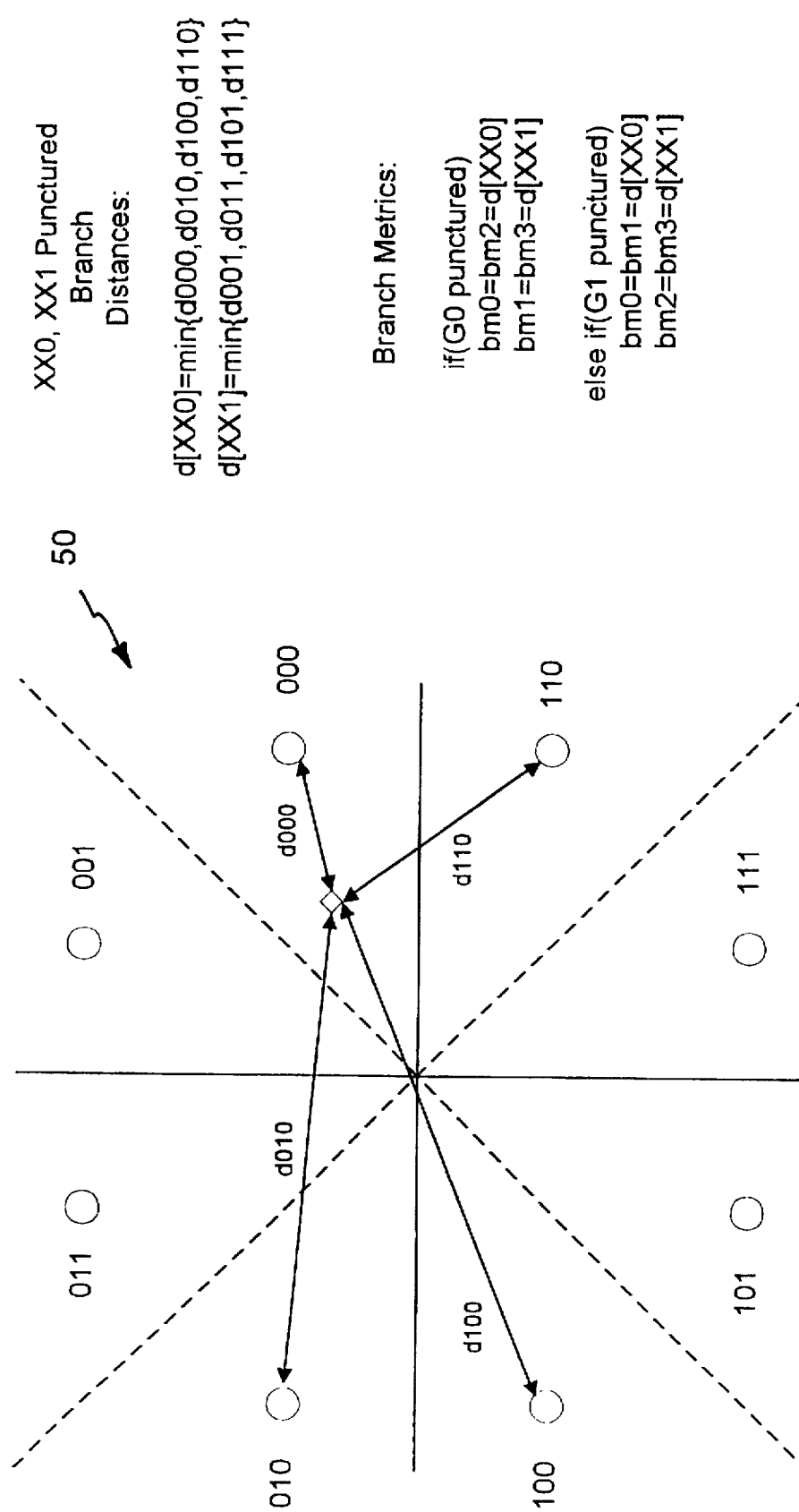
FIG. 4 is an illustration of a branch metric computation for XX0, XX1 punctured branch distances in accordance with the present invention.

The branch metric calculation for punctured and non-punctured branches is illustrated in FIGS. 2–4. For non-punctured branches illustrated at 30 in FIG. 2 (e.g. normal rate ½ operation), the distance is found between the received point and the nearest member of a coset pair (i.e., to X00, X01, X10, and X11 where X represents the uncoded bit in the 8PSK symbol). For X0X and X1X punctured branches illustrated at 40 in FIG. 3 and XX0 and XX1 punctured branches illustrated at 50 in FIG. 4, the minimum Euclidean distance to the second and third LSB of the 8PSK symbol is found, conditioned on a "0" or "1" in those bit positions. In the notations used in FIGS. 3 and 4, d|ijk| is the distance from the received signal to the ijk$^{th}$ 8PSK symbol in the ideal constellation. It should be noted that in the computation of FIG. 3, the distances d|−0X|, d|−1X| for the second bit calculation are applied differently to the branch metrics depending on whether G0 or G1 was punctured. Similarly, in FIG. 4, the distances d|−X0|, d|−X1| for the third bit calculation are applied differently to the branch metrics, depending on whether G0 or G1 was punctured.

Figure 5:
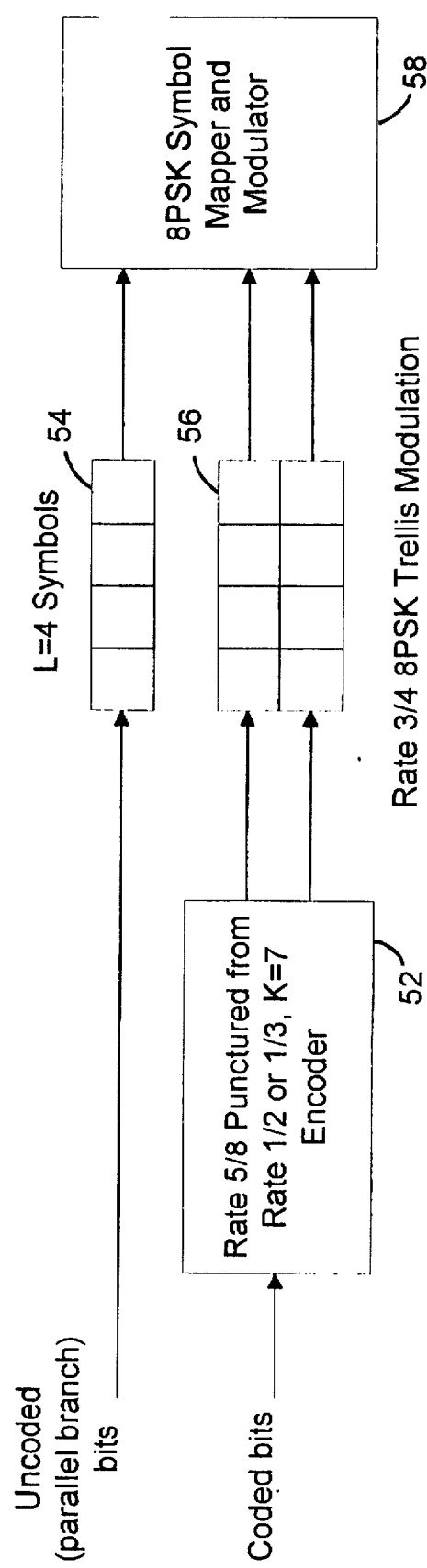
FIG. 5 is a block diagram of a rate ¾ 8PSK trellis encoder in accordance with the present invention.

FIG. 5 illustrates a rate ¾ 8PSK trellis encoder in accordance with the present invention. The uncoded bits (parallel branch bits) are input to an 8PSK symbol mapper and modulator 58 via a first-in first-out (FIFO) register 54 having a length of four bits. Coded bits are punctured by a rate ⅝ convolutional encoder 52, which uses a rate ½ or ⅓ convolutional code (K=7) punctured to rate ⅝. The technique of puncturing is well known in the art, and is explained in detail in J. B. Cain, G. C. Clark, Jr., and J. M. Geist, "Punctured Convoulutional Codes of Rate (n−1)/n and Simplified Maximum Likelihood Decoding," *IEEE Trans. Info. Theory*, Vol. IT-25, pp. 97–100, January 1979, and Y. Yasuda, K. Kashusi, and Y. Hirata, "High-Rate Punctured Convolutional Codes for Soft Decision Viterbi Decoding," *IEEE Trans. on Commun.*, Vol. COM-32, pp. 315–319, March 1984. In the puncturing technique, a fraction of the symbols generated by a rate ½ code is deleted. At the decoder, the deleted symbols are replaced by erasures. One use of the puncturing technique is to permit a single basic code to be used for both power-limited and bandwidth-limited channels. A major advantage of puncturing is that high code rates (n−1)/n can be employed, and be decoded with practical rate 1/n decoders with only modifications in the branch metric generators, where erasures are inserted for the branch punctures.

In the rate ⅝ punctured encoder 52 illustrated in FIG. 5, five source bits (coded bits) are encoded into eight. The eight bits are temporarily stored (buffered) in FIFO registers 56. Successive three bit symbols are provided from registers 54, 56 to the 8PSK symbol mapper and modulator 58. More particularly, each three bit symbol input to mapper and modulator 58 comprises one uncoded bit from register 54 and two coded bits from registers 56. As can be seen from FIG. 5, the registers 54, 56 together have an overall length L of four symbols. Thus, the encoder has an effective rate of ¾, since there are a total of twelve output bits (four uncoded plus eight coded) for nine input bits (four uncoded plus five coded). In other words, it takes only nine input bits to fill the twelve register cells provided by registers 54, 56, for a ratio of nine bits in for twelve bits out (9/12=3/4). It should be appreciated that the specific implementation illustrated in FIG. 5 is for purposes of example only, and that other implementations can be constructed without departing from the teachings of the invention and scope of the claims set forth hereinafter.

Figure 6:
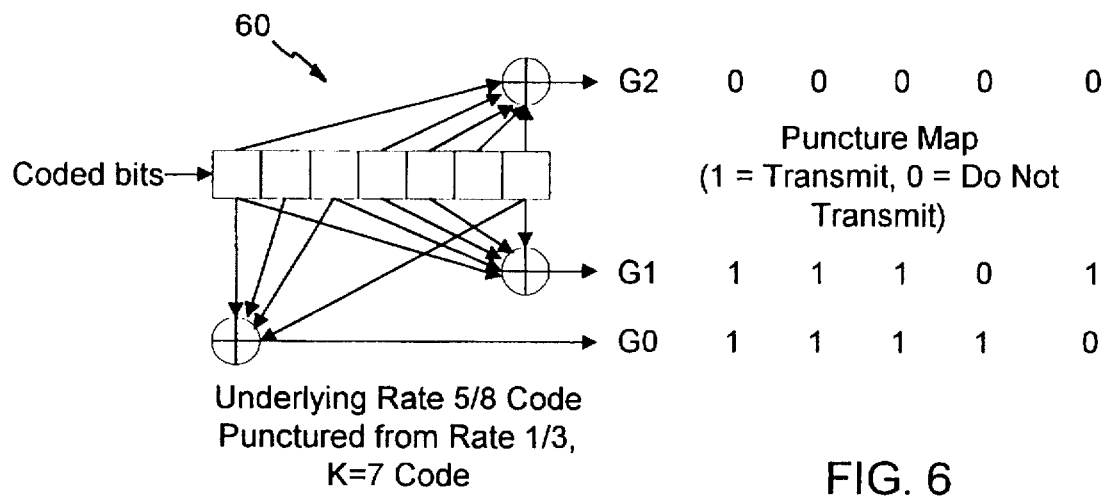
FIG. 6 illustrates an underlying rate ⅝ code punctured from a rate ½, K=7 code that can be used to implement the encoder of FIG. 5.

As indicated above, the rate ⅝ code can be punctured from either a rate ½ or a rate ⅓ convolutional code. FIG. 6 illustrates an encoder 60 for providing a rate ⅝ code from a rate ⅓ K=7 code. The puncture map for this encoder, as shown, is:

G0=1 1 1 1 0

G1=1 1 1 0 1

G2=0 0 0 0 0

Figure 7:
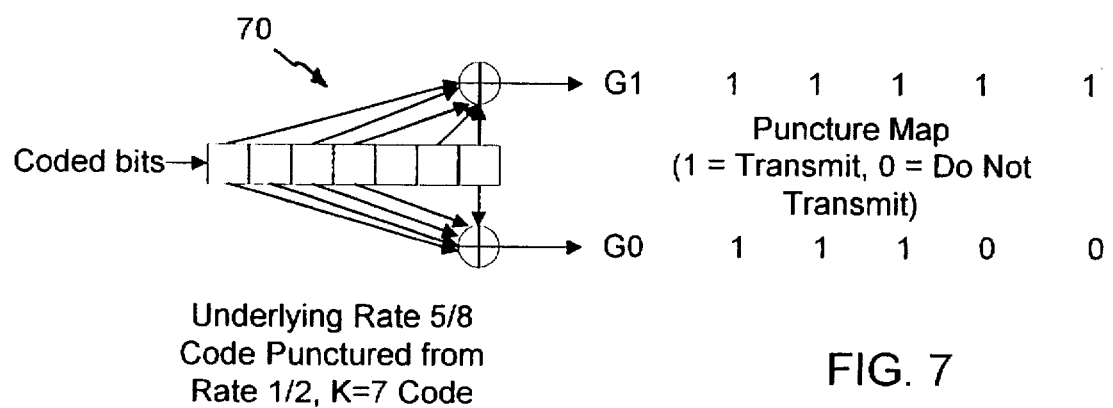
FIG. 7 illustrates an underlying rate ⅝ code punctured from a rate ½, K=7 code that can be used to implement the encoder of FIG. 5.

FIG. 7 illustrates an encoder 70 for providing a rate ⅝ code from a rate ½ K=7 code. The puncture map for this encoder, as shown, is:

G0=1 1 1 0 0

G1=1 1 1 1 1

In the notation used, a "1" designates that the bit is transmitted and a "0" indicates that the bit is not transmitted.

Figure 8:
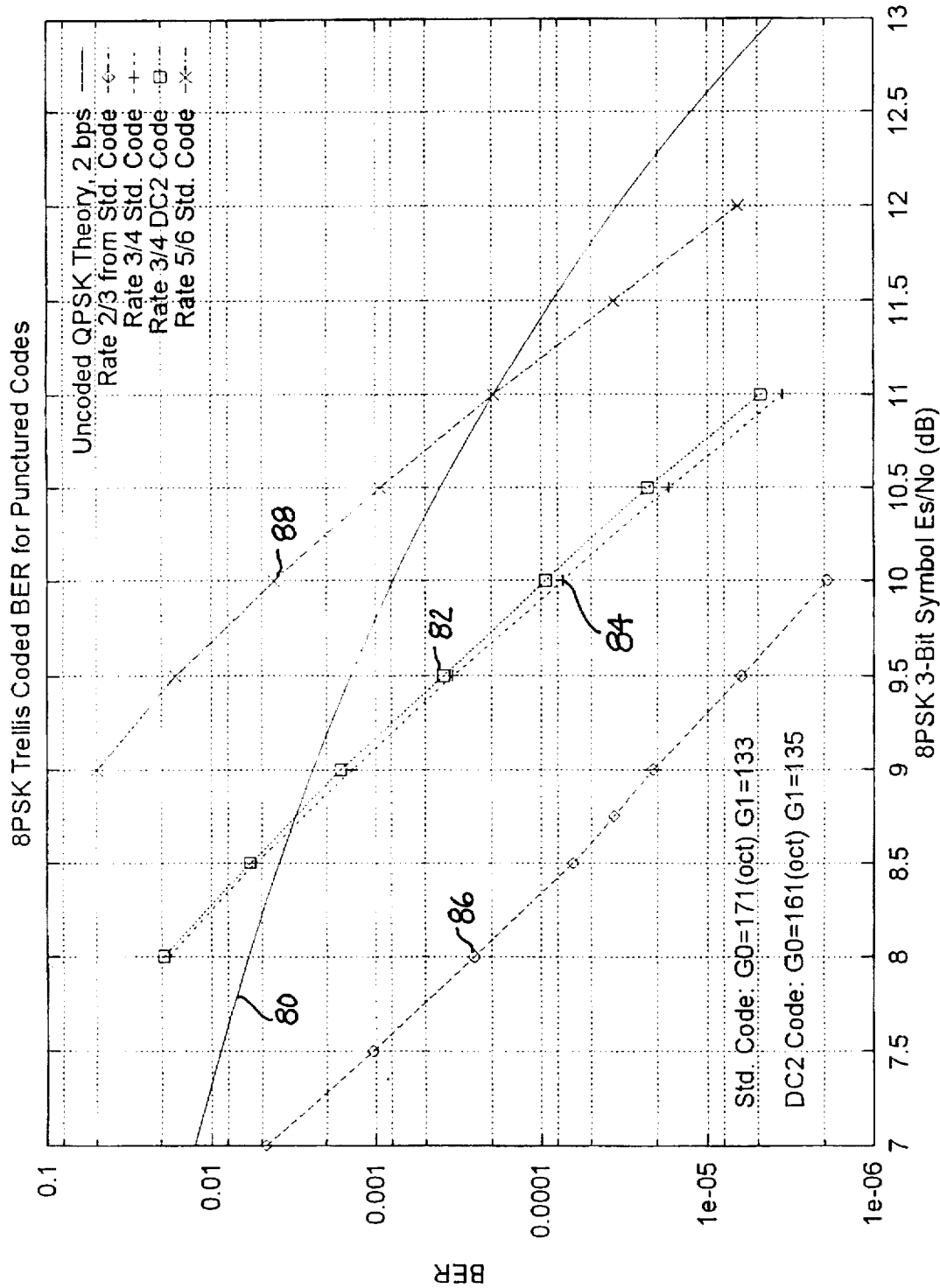
FIG. 8 is a graph plotting the bit error rate against carrier-to-noise ratio (Es/No) for different codes.

FIG. 8 illustrates the 8PSK trellis coded bit error rate (BER) that was calculated for the punctured codes set forth above. In FIG. 8, BER is plotted against the 8PSK 3-bit symbol carrier-to-noise ratio (Es/No) in dB. Line 80 represents the BER of a theoretical uncoded quadrature phase shift keyed (QPSK) signal at 2 bits per second (bps). Line 86 represents the BER of a standard rate ⅔ code. Line 84 illustrates the BER of the rate ¾ 8PSK trellis modulated code of the present invention provided by the encoder of FIG. 7. Line 82 illustrates the results of the rate ¾ 8PSK trellis modulated code of the present invention provided by the encoder of FIG. 6. Line 88 represents the BER of a standard rate ⅚ code, and is provided for comparison purposes only.

As can be seen from FIG. 8, the BER performance for the encoder implementations of FIGS. 6 and 7 (curves 82 and 84) is very close. In particular, the difference in performance is less than 0.1 dB. Moreover, the performance of the inventive implementations is about midway between the rate ⅔ and ⅚ pragmatic codes illustrated by curves 86 and 88, respectively.

It should now be appreciated that the present invention provides a method of puncturing a "standard" rate ½ convolutional code and other codes (e.g., the Digicipher® II rate ⅓ code) to satisfy varying requirements on threshold CNR and bit rate throughput imposed by different communication channels. In particular, two alternative overall rate ¾ 8PSK TCM codes are disclosed that deliver 67.5 Mbps for a 30 Msps baud rate. These codes have a threshold CNR lying midway between known rate ⅔ and ⅚ pragmatic implementations.

What is claimed is:

1. A method for convolutionally encoding digital data with a rate ⅝ convolutional code, comprising the steps of:

puncturing a rate ½ convolutional code to rate ⅝ using a puncture map of:

$$\begin{Bmatrix} 11111 \\ 11100 \end{Bmatrix}$$

wherein the constraint length K=7 and said rate ½ convolutional code is based on octal generators 133, 171; and processing an incoming data stream using said rate ⅝ code.

2. A method in accordance with claim 1 wherein an effective encoder rate of ¾ is provided by combining:

(i) eight coded bits produced by said rate ⅝ code from five input bits, with (ii) four uncoded bits.

3. A rate ⅝ convolutional encoder comprising:

a rate ½ convolutional encoder based on octal generators 133, 171, said rate ½ convolutional encoder having an input for receiving a data stream to be encoded; and means for puncturing the code from said rate ½ convolutional encoder to rate ⅝ using a puncture map of:

$$\begin{Bmatrix} 11111 \\ 11100 \end{Bmatrix}$$

wherein the constraint length K=7.

4. A rate ⅝ convolutional encoder in accordance with claim 3 wherein an effective encoder rate of ¾ is provided by combining:

(i) eight coded bits produced by said rate ⅝ encoder from five input bits, with (ii) four uncoded bits.

5. A method for convolutionally encoding digital data with a rate ⅝ convolutional code, comprising the steps of:

puncturing a rate ⅓ convolutional code to rate ⅝ using a puncture map of:

$$\begin{Bmatrix} 00000 \\ 11101 \\ 11110 \end{Bmatrix}$$

wherein the constraint length K=7 and said rate ⅓ convolutional code is based on octal generators 117, 135, 161; and processing an incoming data stream using said rate ⅝ code.

6. A method in accordance with claim 5 wherein an effective encoder rate of ¾ is provided by combining:

(i) eight coded bits produced by said rate ⅝ code from five input bits, with (ii) four uncoded bits.

7. A rate ⅝ convolutional encoder comprising:

a rate ⅓ convolutional encoder based on octal generators 117, 135, 161, said rate ⅓ convolutional encoder having an input for receiving a data stream to be encoded; and means for puncturing the code from said rate ⅓ convolutional encoder to rate ⅝ using a puncture map of:

$$\begin{Bmatrix} 00000 \\ 11101 \\ 11110 \end{Bmatrix}$$

wherein the constraint length K=7.

8. A rate ⅝ convolutional encoder in accordance with claim 7 wherein an effective encoder rate of ¾ is provided by combining:

(i) eight coded bits produced by said rate ⅝ code from five input bits, with (ii) four uncoded bits.

* * * * *